(12) United States Patent
Huang et al.

(10) Patent No.: US 9,948,232 B2
(45) Date of Patent: Apr. 17, 2018

(54) METHOD FOR FABRICATING FLEXIBLE SOLAR PANEL MODULE

(71) Applicant: ETERBRIGHT SOLAR CORPORATION, Miaoli County (TW)

(72) Inventors: Ting-Hui Huang, Miaoli County (TW); Chen-Nan Chou, Miaoli County (TW)

( * ) Notice: Subject to any disclaimer, the term of this patent is extended or adjusted under 35 U.S.C. 154(b) by 0 days.

(21) Appl. No.: 15/396,829

(22) Filed: Jan. 3, 2017

(65) Prior Publication Data

US 2017/0149376 A1    May 25, 2017

Related U.S. Application Data

(62) Division of application No. 14/711,817, filed on May 14, 2015.

(51) Int. Cl.

| | |
|---|---|
| *H02S 30/20* | (2014.01) |
| *H01L 31/048* | (2014.01) |
| *H01L 31/049* | (2014.01) |
| *H01L 31/02* | (2006.01) |
| *H02S 40/36* | (2014.01) |
| *H02S 40/34* | (2014.01) |

(52) U.S. Cl.
CPC ........ *H02S 30/20* (2014.12); *H01L 31/02013* (2013.01); *H01L 31/049* (2014.12); *H01L 31/0481* (2013.01); *H02S 40/34* (2014.12); *H02S 40/36* (2014.12)

(58) Field of Classification Search
CPC ............... H01L 31/03926; H01L 31/1896
See application file for complete search history.

(56) References Cited

U.S. PATENT DOCUMENTS

| | | | | |
|---|---|---|---|---|
| 8,895,835 | B2 * | 11/2014 | Chaney | B32B 37/06 136/244 |
| 2011/0239450 | A1 * | 10/2011 | Basol | B32B 37/22 29/738 |
| 2012/0152327 | A1 * | 6/2012 | Pinarbasi | H01L 31/03928 136/251 |
| 2014/0076393 | A1 | 3/2014 | Chang et al. | |
| 2014/0238462 | A1 * | 8/2014 | Jang | H01L 31/0508 136/244 |

\* cited by examiner

*Primary Examiner* — Seahvosh Nikmanesh (57) ABSTRACT

A flexible solar panel module is provided having a plurality of non-flexible solar panels, a plurality of non-flexible covers and a flexible back sheet. Each of the non-flexible solar panels has a photoreactive device layer, a positive ribbon and a negative ribbon. The non-flexible covers correspond to the non-flexible solar panels respectively and are disposed on front surfaces of the non-flexible solar panels. Each of the non-flexible covers is bigger in size than each of the non-flexible solar panels. The flexible back sheet is disposed under back surfaces of the non-flexible solar panels and has a plurality of openings therein. A first water-resistant sealant is disposed between adjacent non-flexible covers and physically contacts the flexible back sheet. A second water-resistant sealant is disposed between the non-flexible covers and the flexible back sheet and covers sidewalls of the non-flexible solar panels. The non-flexible solar panels are laminated with the flexible back sheet and regions between adjacent non-flexible solar panels are flexible/bendable regions of the flexible solar panel module.

7 Claims, 7 Drawing Sheets

METHOD FOR FABRICATING FLEXIBLE SOLAR PANEL MODULE

BACKGROUND OF THE INVENTION

Field of the Invention

The present invention relates to a flexible solar panel module, an installed structure thereof and a method for fabricating such a flexible solar panel module.

Description of Related Art

In order to achieve higher power output, traditional solar panel modules usually integrate multiple solar panels. By doing so, traditional solar panel modules have large sizes and require large spaces for installation. Newer solar panel modules may have better flexibility to fit topography and better portability, but they require higher manufacturing cost and have lower power output.

Therefore, the industry needs an improved flexible solar panel module which can be manufactured with less cost and is capable of outputting higher power.

SUMMARY OF THE INVENTION

One purpose of the present invention is to provide a flexible solar panel module comprising a plurality of non-flexible solar panels, a plurality of non-flexible covers, a flexible back sheet, a first water-resistant sealant and a second water-resistant sealant. Such flexible solar panel module has advantages of low manufacturing cost and high power output.

Another purpose of the present invention is to provide a installed structure comprising the flexible solar panel module, a plurality of openings in the flexible back sheet, a plurality of fasteners and a third water-resistant sealant.

The present invention also provides a method for fabricating the flexible solar panel module.

DETAILED DESCRIPTION OF THE INVENTION

The following descriptions illustrate preferred embodiments of the present invention in detail. All the components, sub-portions, structures, materials and arrangements therein can be arbitrarily combined in any sequence despite their belonging to different embodiments and having different sequence originally. All these combinations are falling into the scope of the present invention.

There are a lot of embodiments and figures within this application. To avoid confusions, similar components are designated by the same or similar numbers. To simplify figures, repetitive components are only marked once.

Figure 1:
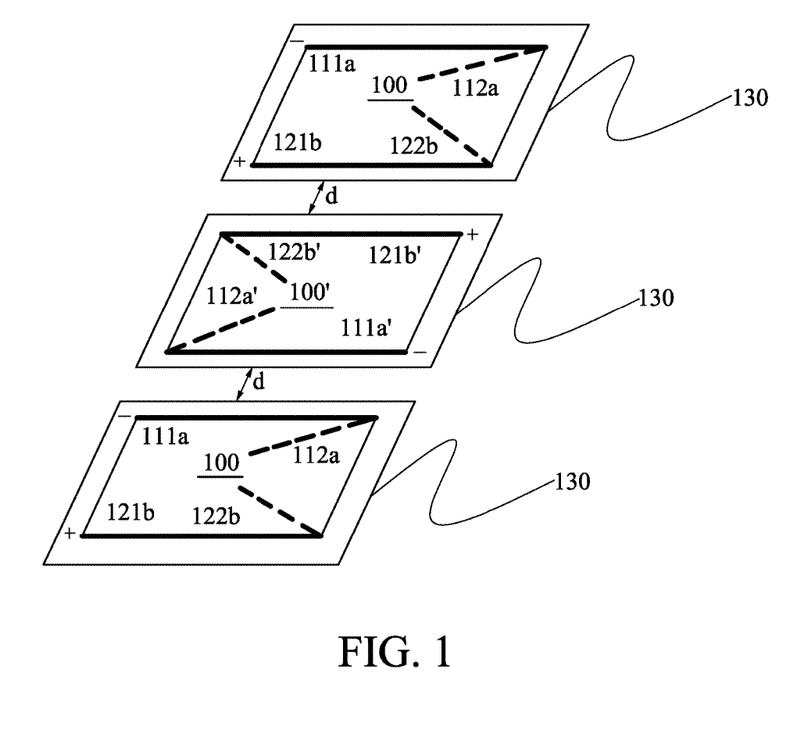
FIGS. 1-3 show a method for fabricating a flexible solar panel module according to an embodiment of the present invention.
Figure 2:
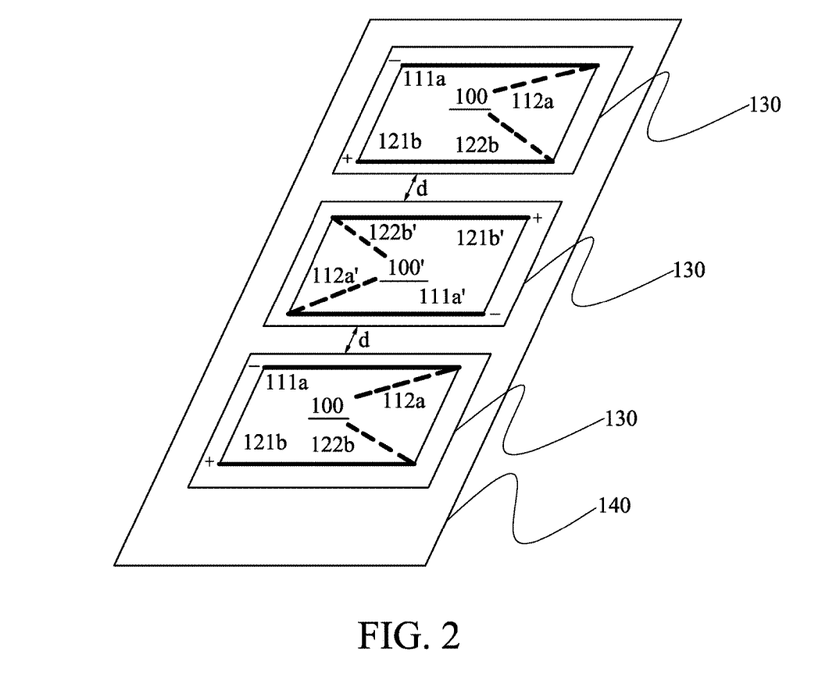
Figure 3:
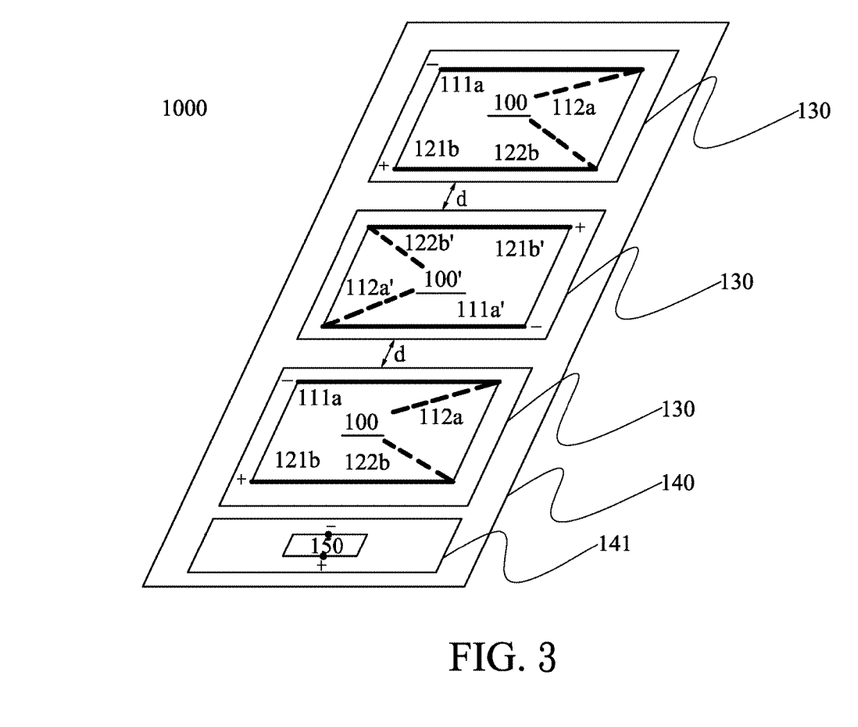
Figure 4:
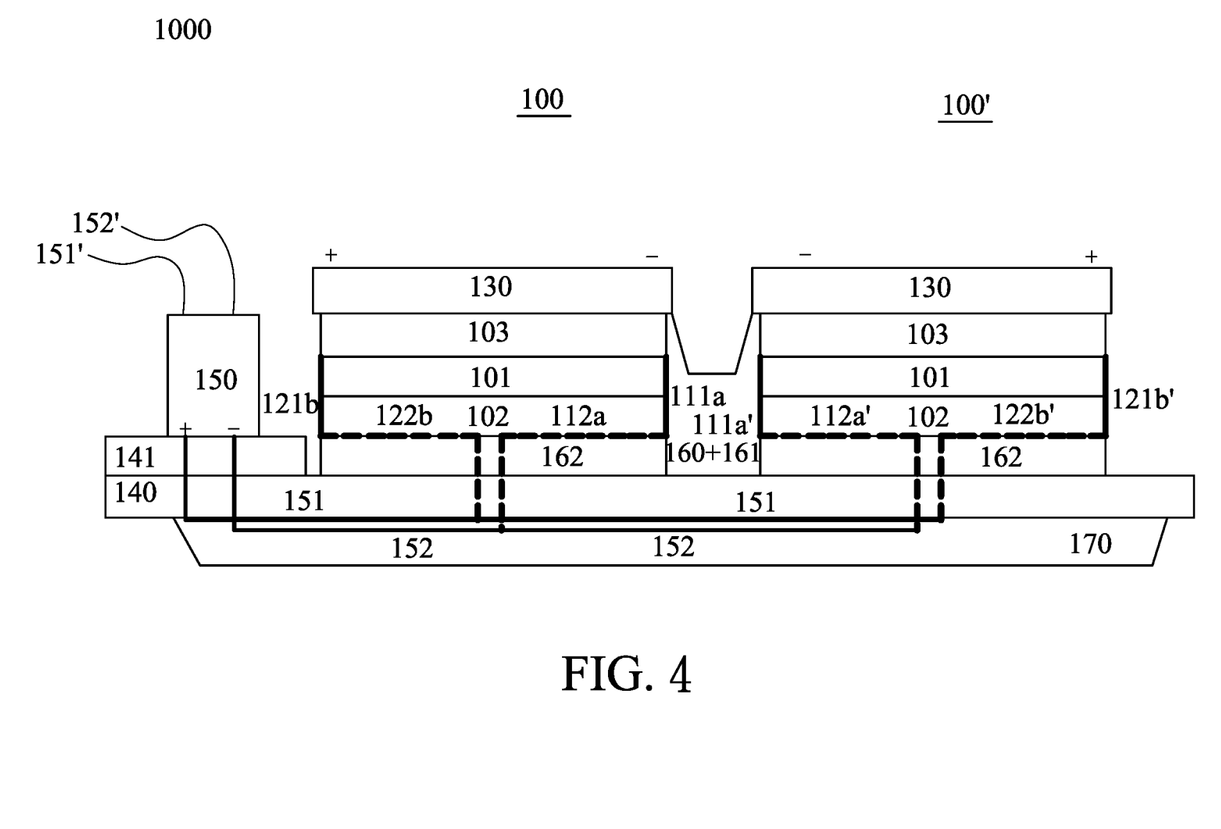
FIG. 4 shows a schematic cross-sectional view of the flexible solar panel module of FIG. 3.

Now refer to FIGS. 1-3 and 4. FIGS. 1-3 show a method for fabricating a flexible solar panel module 1000 according to an embodiment of the present invention. FIG. 4 shows a schematic cross-sectional view of the flexible solar panel module 1000 of FIG. 3. First, prepare a plurality of non-flexible solar panels 100 and 100' and a plurality of non-flexible covers 130 such as glass covers disposed on the front surfaces of the non-flexible solar panels 100 and 100' as shown in FIG. 1. Each non-flexible cover 130 corresponds to a non-flexible solar panel 100 (100') and is bigger in size than a non-flexible solar panel 100 (100'). Although FIG. 1 only shows three non-flexible solar panels for illustration, the present invention can be applied to more than three non-flexible solar panels. As shown in FIG. 4, each non-flexible solar panel 100 (100') comprises a stacked structure having from bottom to top a back glass 102 and a photoreactive device layer 101. The photoreactive device layer 101 comprises from bottom to top a lower electrode layer, a photoelectric conversion layer, an optional buffer layer and a transparent upper electrode layer such as indium tin oxide (ITO) and/or zinc oxide (ZnO). The electrode layer and the transparent upper electrode layer are configured to conduct electrical current generated by the photoelectric conversion layer. The photoelectric conversion layer is configured to receive light penetrating the transparent upper electrode layer and the optional buffer layer and convert the light into electricity. The photoelectric conversion layer may be formed from a semiconductor material composed of copper (Cu), indium (In), gallium (Ga) and selenium (Se). Alternatively, the photoelectric conversion layer may be formed from a semiconductor compound material comprising Ib group element such as copper (Cu) or silver (Ag), IIIb group element such as aluminum (Al), gallium (Ga) or indium (In) and VIb group element such as sulfur (S), selenium (Se) or tellurium (Te). The optional buffer layer is configured to protect the photoelectric conversion layer during patterning of the photoelectric conversion layer and facilitate current conducting. The non-flexible solar panels 100 and 100' are the same in view of their structures and their difference lies on their orientations. Therefore, this application only describes the non-flexible solar panel 100 in detail and the details of the non-flexible solar panel 100' are omitted. Each non-flexible solar panel 100 (100') further comprises a front side positive ribbon 121b (121b') and a front side negative ribbon 111a (111a') at two long sides opposite to each other of the front surface of the solar panel 100 (100'), a backside positive ribbon 122b (122b') as a part of the front side positive ribbon 121b (121b') folded back to the back surface of the non-flexible solar panel 100 (100') and a backside negative ribbon 112a (112a') as a part of the front side negative ribbon 111a (111a') folded back to the back surface of the non-flexible solar panel 100 (100'). In most of the figures of the present invention, the backside positive ribbon 122b (122b') and the backside negative ribbon 112a (112a') are shown by dashed lines to be different from the front side positive ribbon 121b (121b') and the front side negative ribbon 111a (111a') shown by solid lines. The front side positive ribbon 121b (121b') and the front side negative ribbon 111a (111a') are used as a positive electrode and a negative electrode of the non-flexible solar panel respectively. It should be noted that the drawings of this invention including the FIG. 4 are not drawn to scale. For example, the widths of the front side positive ribbon 121b (121b') and the front side negative ribbon 111a (111a') are much smaller than the widths of the photoreactive device layer 1 and the back glass 102, but they are exaggerated in the figures in order to clearly illustrate the electrical connections with other elements. Furthermore, in a real cross-sectional view taken along a cutting line one can not see the front side positive ribbon 121b (121b') and the front side negative ribbon 111a (111a') in connection with the backside positive ribbon 122b (122b') and the backside negative ribbon 112a (112a'), but FIG. 4 is drawn to show all of them in order to illustrate the connection relation of the ribbons. Moreover, the focus of FIG. 4 is to show special relation between different elements, so the details of each element are not shown; for example, the photoreactive device layer 101 should comprise a patterned lower electrode layer, a patterned photoelectric conversion layer, an optional patterned buffer layer and a patterned transparent upper electrode layer, but these layers are not shown and only the unpatterned photoreactive device layer 101 is shown to represent these layers. The ribbons for example can be made from copper foil, copper ribbon, foils of other metals or alloy or ribbons of other metals or alloys. Each non-flexible solar panel 100 (100') comprises at least one solar unit cell or comprises many solar unit cells electrically connected in serial. The thickness of the non-flexible covers 130 should be as thin as possible.

Then as shown in FIG. 2, dispose the plurality of non-flexible solar panels 100 and 100' in juxtaposed relation on a flexible back sheet 140 and a first encapsulant (not shown in this figure) could be disposed between the plurality of non-flexible solar panels 100 and 100' and the flexible back sheet 140. Also as shown in FIG. 2, dispose each of the plurality of non-flexible covers 130 on the front surface of a corresponding one of the non-flexible solar panels 100 and 100' and a second encapsulant (not shown in this figure) could be disposed between the non-flexible covers 130 and the front surfaces of the non-flexible solar panels 100 and 100'. The first encapsulant for example is a thermoplastic encapsulant such as ethylene Vinyl Acetate (EVA), polyolefin (PO) and polyvinyl butyral (PVB), or an UV curable encapsulant, or a combination thereof. The second encapsulant and the first encapsulant use similar materials and they could use the same material or different materials. Each non-flexible solar panel 100 should keep an appropriate distance from adjacent non-flexible solar panel 100'. That is, the shortest distance between each non-flexible solar panel 100 and its adjacent non-flexible solar panel 100' should be at least the length d. The flexible back sheet 140 may be a high-tensile plastic sheet such as polyethylene (PE) sheet, polyamide (PA) sheet, polyethylene terephthalate (PET) sheet or a combination thereof. The back sheet may also be a combination of a material from above and a metallic foil attached thereto. The flexible back sheet 140 has a plurality of openings (not shown) and each solar panel 100 (100') corresponds to at least one opening in a central region (or other region) of said each solar panel 100 (100'). The backside positive ribbon 122b (122b') and the backside negative ribbon 112a (112a') of each solar panel 100 (100') extend through the first encapsulant (not shown) and at least one of plurality of openings (not shown) and electrically connect outward (to other solar panels and to a connection box 150 which will be discussed later). Next, the non-flexible covers 130, the second encapsulant, the plurality of non-flexible solar panels 100 and 100', the first encapsulant and the flexible back sheet 140 are laminated together by at least one vacuum laminating process.

Then, as shown in FIG. 3 and referring to FIG. 4, install a connection box 150 in a front surface of the flexible back sheet 140. In order to strengthen the portion of the flexible back sheet 140 in contact with the connection box 140, a reinforcing layer 141 could be disposed between the connection box 140 and the flexible back sheet 140. The reinforcing layer 141 and the flexible back sheet 140 may use the same material (materials) or different materials. Except in the region in contact with the connection box, the reinforcing layer 141 may optionally be further disposed in a periphery region of the flexible back sheet 140. As shown in FIG. 4, connect the backside positive ribbon 122b (122b') of each non-flexible solar panel 100 (100') extending through at least one opening (not shown) of the flexible back sheet 140 to the backside positive ribbon 122b (122b') of the adjacent non-flexible solar panel 100 (100') via a backside conductive line 151 lying along the back surface of the flexible back sheet 140; connect the backside negative ribbon 112a (112a') of each non-flexible solar panel 100 (100') extending through at least one opening (not shown) of the flexible back sheet 140 to the backside negative ribbon 112a' (112a) of the adjacent non-flexible solar panel 100' (100) via a backside conductive line 152 lying along the back surface of the flexible back sheet 140. Connect the backside positive ribbon 122b (122b') of the non-flexible solar panel 100 (100') next to the connection box 150 to the anode of the connection box 150 via a backside conductive line 151 while connect the backside negative ribbon 112a (112a') of the same non-flexible solar panel 100 (100') to the cathode of the connection box 150 via a backside conductive line 152. Now the flexible solar panel module 1000 of the present invention is basically completed. The backside conductive lines 151 and 152 may be extensions of the backside negative ribbon 112a (112a') and the backside negative ribbon 112a (112a') respectively, or they may be independent conductive lines. The connection box 150 further comprises a positive line 151' and a negative line 152' to electrically connect the flexible solar module 1000 to external devices. Moreover, further dispose a first water-resistant sealant 160 such as thermoplastic polyolefin (TPO) between adjacent non-flexible covers 130 in physical contact with the flexible back sheet 140 and dispose a second water-resistant sealant 161 such as butyl rubber between the non-flexible covers 130 and the non-flexible solar panels 100 and 100' to protect the non-flexible solar panels 100 and 100' against moisture and mechanical force and allow regions between adjacent non-flexible solar panels 100 and 100' to be flexible/bendable regions. The first water-resistant sealant 160 and the second water-resistant sealant 161 may use the same material (materials) or different materials. Optionally, in a portion of the back surface of the flexible back sheet 140 where the backside conductive lines 151 and 152 are exposed another water-resistant sealant could be disposed in order to protect the backside conductive lines 151 and 152 from moisture and mechanical. This water-resistant sealant could use the material (materials) used by the flexible back sheet 140 or use a material different from the material used by the flexible back sheet 140.

In the embodiment shown in FIGS. 1-3 and 4, due to the flexibility of the flexible back sheet 140, the flexible solar panel module 1000 has multiple flexible/bendable regions (regions representing by distance d in FIGS. 1-3) as long as there are sufficient gaps (distances) between the adjacent non-flexible solar panels 100 and 100'. In a preferred embodiment, the gap distance (shortest distance) between two adjacent non-flexible solar panels 100 and 100' should not be less than a combined thickness of a non-flexible solar panel 100 (100') and a non-flexible cover 130. Additionally, in a case where the back glass 102 of a non-flexible solar panel 100 (100') and a non-flexible cover 130 are both sufficiently thin such as both equivalent to or less than 2.0 mm, the non-flexible solar panel 100 (100') may become slightly bendable, thereby further increasing the flexibility of the flexible solar panel module 1000. Furthermore, in the embodiment shown in FIGS. 1-3 and 4 the non-flexible solar panels 100 and 100' are electrically connected in parallel, but the present invention can be applied to a solar panel module where the non-flexible solar panels 100 and 100' are connected in serial.

Figure 4A:
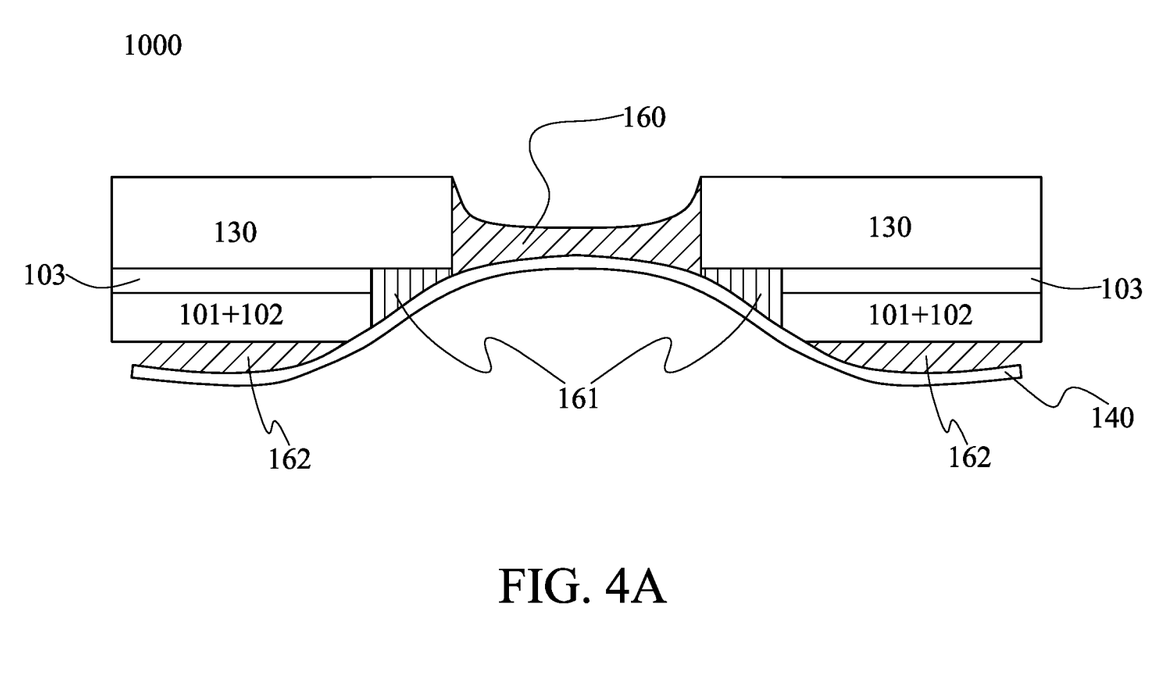
FIG. 4A shows an enlarged view of a local region of the flexible solar panel module of the present invention focusing on the flexibility and the distribution of sealants.

Now refer to FIG. 4A. FIG. 4A shows an enlarged view of a local region of the flexible solar panel module of the present invention focusing on the flexibility and the distribution of sealants. To simplify the view, all the ribbons and conductive lines are omitted. As shown in FIG. 4A, in a case where there are sufficient gaps between adjacent non-flexible covers 130, the regions of the flexible back-sheet 140 between adjacent non-flexible covers 130 become flexible. Due to the vacuum sucking effect occurred during vacuum laminating process, the flexible back sheet 140 would be closer to the non-flexible covers 130 in an area without solar panels such as the periphery area surrounding the non-flexible solar panels 100 and 100' and the gap regions between adjacent non-flexible solar panels 100 and 100'. However, the distance between the flexible back sheet 140 and the non-flexible covers panel 140 in the areas with the non-flexible solar panels 100 and 100' would be approximately the same due to the thickness of the non-flexible solar panels 100 and 100'. Practically, except the first water-resistant sealant 160 disposed between adjacent non-flexible covers 130, further dispose a second water-resistant sealant 161 between the non-flexible covers 130 and the flexible back sheet 140 to cover sidewalls of the non-flexible solar panel panels 100 and 100' as shown in FIGS. 4 and 4A. The second water-resistant sealant 161 may comprise a material used by the first water-resistant sealant 160 such as thermoplastic polyolefin (TPO) or a material different from the material used by the first water-resistant sealant 160 such as butyl rubber. The reference number 162 in FIG. 4A represents the first encapsulant disposed between the flexible back sheet 140 and the non-flexible solar panels 100 and 100' while reference number 103 in FIG. 4A represents the second encapsulant disposed between the non-flexible covers 130 and the non-flexible solar panels 100 and 100'. Since all the surfaces of the non-flexible solar panels 100 and 100' are covered by either encapsulants (first and second encapsulants 162 and 103) or water-resistant sealants (first and second water-resistant sealants 160 and 161), the photoreactive device layer 101 of the non-flexible solar panels 100 and 100' would not generate due to moisture and the non-flexible solar panels 100 and 100' would be secured without using a frame required by traditional solar panel modules.

Figure 5:
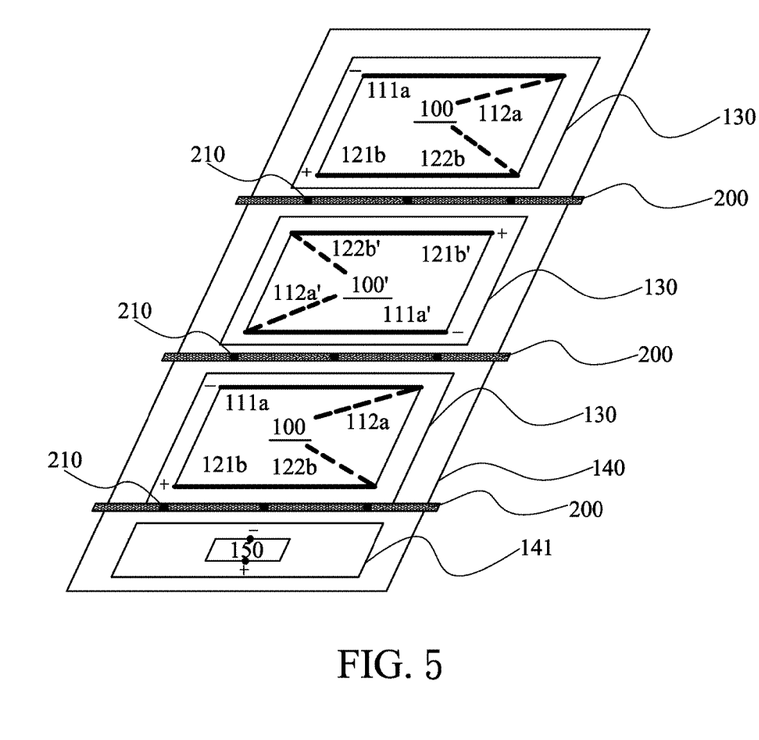
FIG. 5 shows a top view of an installed structure of the flexible solar panel module of the present invention.
Figure 6:
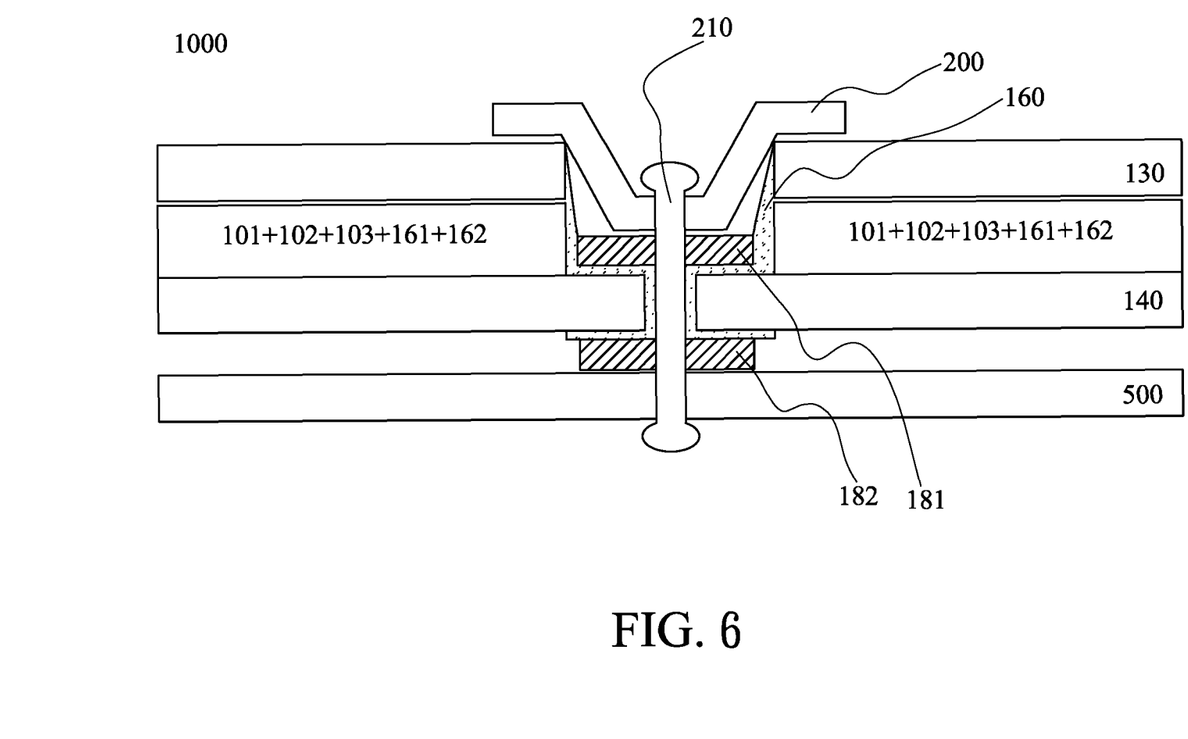
FIG. 6 shows a cross-sectional view of the installed structure of the flexible solar panel module of FIG. 5.

Now refer FIGS. 5 and 6. FIG. 5 shows a top view of an installed structure of the flexible solar panel module 1000 of the present invention. FIG. 6 shows a cross-sectional view of the installed structure of the flexible solar panel module 1000 of FIG. 5. When installing the flexible solar panel module 1000, form multiple holes (FIG. 6 only shows an exemplary hole) in the flexible back sheet 140 (and the first water-resistant sealant 160) in regions between the non-flexible solar panels 100 and 100' and/or in an area between and non-flexible solar panel 100 (100') and the connection box 150 and/or in a periphery region surrounding the non-flexible solar panels 100 and 100' and secure the flexible solar panel modules 1000 on a surface such as an upper surface of a roof sheet or a support frame 500 using multiple fixtures 210 (FIG. 6 shows only an exemplary fixture) penetrating the multiple holes. The flexible solar panel module 1000 of the present invention is capable of outputting high power through electrically connecting the plurality of non-flexible solar panels 100 and 100' in parallel and is capable of adapting to different topographies due to flexibility/bendability and being installed permanently at a desired installation site. In considerations of adapting to different topographies and being installed permanently, stability and water-resistance of an installed structure of the flexible solar panel module 1000 are required. To that end, the first water-resistant sealant 160 (or a third water-resistant sealant using the same material or a different material) is disposed between a recessed surface defining the hole and the fixture 210 to fill or at least partially fill the gap between the recessed surface and the fixture 210 and the first water-resistant sealant 160 (or a third water-resistant sealant using the same material or a different material) may further extend to the back surface of the flexible back sheet 140 surrounding the hole in order to prevent moisture from getting in the hole. Moreover, optional water-resistant washers 181 and 182 may be disposed above the hole (thus the flexible back sheet 140) and below the hole (thus below the flexible back sheet 140) to further prevent moisture from getting in the hole.

In order to increase stability and reliability of the installed structure of the flexible solar panel module 1000, an optional cap 200 may be disposed on the flexible back sheet 140. The width (along a direction parallel to the paper) of the cap 200 can be so chosen that the cap extends on at least one non-flexible cover 130 (FIG. 6 shows the cap extending on two non-flexible covers 130 on its both sides) or the cap is only between adjacent solar panels 100 and 100' (thus between adjacent non-flexible covers). The length (along a direction perpendicular to the paper) of the cap 200 can also be so chosen that the length of the cap 200 is larger than the length of one non-flexible solar panel as shown in FIG. 5 or the length of the cap 200 is much less than the length of one non-flexible solar panel with multiple caps 200 disposed as islands within the flexible solar panel module 1000. The shape and dimension of the optional water-resistant washer 181 can be the same as or different from the shape and dimension of the cap 200. For example, the optional water-resistant washer 181 may extend on at least one of the non-flexible covers 130, extend to partially or completely cover sidewalls of two adjacent non-flexible solar panels 100 and 100', or is limited between two adjacent non-flexible solar panels 100 and 100'. The fixture 210 may be a screw, a rivet, a fastener, etc. Depending on the length of the cap 200, one cap 200 may have multiple holes therein corresponding to multiple fixtures 210 (as shown in FIG. 5) or may have only one hole therein corresponding to single fixture 210. If an installed structure of the flexible solar panel module 1000 is desired to be permanently fixed at a location, a layer of a thermoplastic material may be optionally disposed on the surface (such as a front surface of a roof sheet 500 or ground surface) on which the module 1000 is to be installed before installing the module 1000. By doing so, the flexible solar panel module 1000 can be directly mounted on the surface through a thermal setting process.

The flexible solar panel module of the present invention is capable of generating high power, has better flexibility to fit various topographies and has advantage of high reliability due to high water-resistance. Furthermore, it is easy to fabricate and install the flexible solar panel module of the present invention, so manufacturing cost is reduced and utility is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a flexible solar panel module, comprising:
   providing a plurality of solar panels comprising glass and a plurality of glass covers;
   disposing the plurality of solar panels in juxtaposed relation on a first side of a flexible back sheet, wherein there is a predetermined distance between two adjacent solar panels and a first encapsulant is disposed between the plurality of solar panels and the flexible back sheet;
   disposing a plurality of glass covers corresponding to the plurality of solar panels respectively on the plurality of solar panels, wherein a second encapsulant is disposed between the plurality of glass covers and the plurality of solar panels; and
   vacuum laminating the plurality of glass covers, the second encapsulant, the plurality of solar panels, the first encapsulant and the flexible back sheet,
   wherein there is a first water-resistant sealant disposed between adjacent glass covers and physically contacting the flexible back sheet and there is a second water-resistant sealant disposed between the glass covers and the flexible back sheet and covering sidewalls of the solar panels, wherein the first water-resistant sealant has a first thickness closer to the glass covers and a second thickness further away from the glass covers, and the first thickness is larger than the second thickness.

2. The method for fabricating a flexible solar panel module according to claim 1, wherein the flexible back sheet comprises a plurality of openings therein and each said solar panel comprises a positive ribbon and a negative ribbon, the method further comprising:
   extending the positive ribbon and the negative ribbon from the first side of the flexible back sheet to a second side opposite to the first side through at least one of the openings.

3. The method for fabricating a flexible solar panel module according to claim 2, further comprising:
   disposing a connection box on the first side of the flexible back sheet and electrically connecting the connection box and the plurality of the solar panels.

4. The method for fabricating a flexible solar panel module according to claim 1, wherein the first water-resistant sealant is different from the second water-resistant sealant.

5. The method for fabricating a flexible solar panel module according to claim 1, further comprising:
   installing a connection box and a reinforcing layer, the connection box being electrically connected to the plurality of solar panels in parallel and the reinforcing layer being disposed between the connection box and the flexible back sheet.

6. The method for fabricating a flexible solar panel module according to claim 1, wherein a shortest distance between two adjacent solar panels is not less than a combined thickness of one of the plurality of solar panels and one of the plurality of glass covers.

7. The method for fabricating a flexible solar panel module according to claim 1, wherein a thickness of one of the plurality of glass covers is equivalent to or less than 2.0 mm.

* * * * *